United States Patent

Shirakawa et al.

[11] Patent Number: 5,236,549
[45] Date of Patent: Aug. 17, 1993

[54] PROCESS FOR PLASMA ETCHING

[75] Inventors: Kenji Shirakawa; Hidenori Sekiya, both of Fukuoka, Japan

[73] Assignee: Mitsubishi Denki Kabushiki Kaisha, Tokyo, Japan

[21] Appl. No.: 757,364

[22] Filed: Sep. 10, 1991

[30] Foreign Application Priority Data

Sep. 17, 1990 [JP] Japan .................. 2-248470

[51] Int. Cl.$^5$ .................. H01K 21/306; B44C 1/22; C03C 15/00; C23F 1/00
[52] U.S. Cl. .................. 156/643; 156/651; 156/653; 156/656; 156/657; 156/659.1; 156/665; 156/345; 437/228; 437/238; 437/245
[58] Field of Search .............. 156/643, 650, 651, 652, 156/653, 656, 657, 659.1, 662, 665, 345; 204/192.32, 192.35, 192.37; 437/228, 233, 238, 241, 245, 189, 197-199

[56] References Cited

U.S. PATENT DOCUMENTS

| 4,528,066 | 7/1985 | Merkling et al. | 156/651 X |
| 4,915,779 | 4/1990 | Srodes et al. | 156/643 |
| 5,013,398 | 5/1991 | Long et al. | 156/651 X |
| 5,017,265 | 5/1991 | Park et al. | 156/643 |
| 5,035,768 | 7/1991 | Mu et al. | 156/643 |

FOREIGN PATENT DOCUMENTS 2-77123 3/1990 Japan .

Primary Examiner—William A. Powell
Attorney, Agent, or Firm—Lowe, Price, LeBlanc & Becker

[57] ABSTRACT

Plasma is produced continuously in an etching switching period for switching from a partial plasma etching process to the next partial plasma etching process to thereby proceed with anisotropic plasma etching even in the etching switching period. There is no period in which isotropic etching is performed throughout the process. The time period for executing the partial plasma etching process, which follows the etching switching period, is shortened while throughput is improved.

15 Claims, 9 Drawing Sheets

PROCESS FOR PLASMA ETCHING

BACKGROUND OF THE INVENTION

1. Field of the Invention

The present invention relates to a process for plasma etching layer formed on a substrate, in which a plurality of partial plasma etching processes with different etching parameters are performed in series.

2. Description of the Background Art

Plasma etching is performed by the use of low temperature plasma produced by the excitation of a reactive gas. Since it permits a layer to be etched with predetermined dimensions, the plasma etching has been one of the bases of fine patterning in high-technology for processing. In the plasma etching process, it is general to perform a plurality of partial plasma etching processes with different etching parameters in accordance with the characteristics of each portion of the layer to be etched.

FIGS. 1A to 1E are sectional views illustrating various stages of a conventional plasma etching process. FIG. 2 is a graph showing stepwise changes in etching parameters and the like in the process. In FIG. 2, reference character P designates a pressure within a chamber for storing therein a substrate on which the layer to be etched is formed (in Torr); Cl designates the amount of chlorine or chlorine compound gas supplied to the chamber in SCCM (Standard Cubic Centimeter per Minute); and V designates the on/off state of a high-frequency power source for producing plasma within the chamber. When the high-frequency power source is on, discharge plasma is produced within the chamber.

As shown in FIG. 1A, an Al alloy film 2 to be etched which is wiring material is formed on a substrate of a Si wafer 1. A spontaneous oxide film 3 is formed on the Al alloy film 2 spontaneously when the Al alloy film 2 is produced. A photoresist 4 patterned by photolithography technique is formed on the spontaneous oxide film 3. Hereinafter discussed is the etching of the Al alloy film 2 using the photoresist 4 as a mask.

After a stand-by period TI shown in FIG. 2, the pressure P within the chamber and the amount Cl of supplied gas are set to target values of 30 Torr and 50 SCCM, respectively, in a first plasma etching period T2 (for 30 seconds) for mainly etching the spontaneous oxide film 3. When the pressure P and the amount Cl reach the target values, the high-frequency power source is turned on. The gas molecules within the chamber are exited to turn into exited molecules, which etch the spontaneous oxide film 3. At this time, the surface portions of the Al alloy film 2 ere etched.

FIG. 3 illustrates this process in detail. The gas molecules 11 are turned into the exited molecules 12, which are accelerated downwardly in FIG. 3 by ion sheath potential. The excited molecules 12 react with the surface portions of the Al alloy film 2 so that reaction products 13 are formed. Some of the reaction products 13 are deposited on the side faces of the steps formed by etching in the Al alloy film 2, thereby sidewall protective films 15 (in FIG. 1B) being formed. The sidewall protective films 15 can prevent the Al alloy film 2 from being etched on the side faces. Thus, the sidewall protective films 15 are helpful for improvement in anisotropic property of plasma etching, by which the Al alloy film 2 is etched only perpendicularly to the surface thereof.

When the first plasma etching is terminated, the etching parameters P and Cl must be changed in order to perform a second plasma etching which is mainly intended for the etching of the Al alloy film 2. For this purpose, the high-frequency power source is turned off to suspend the production of plasma. An etching switching period T3 (for 10 seconds) starts.

When the pressure P within the chamber and the amount Cl of supplied gas reach 15 Torr and 100 SCCM, respectively, the high-frequency power source is turned on again, and a second plasma etching period T4 (for 30 seconds) starts. In the period T4, the second plasma etching is performed on the Al alloy film 2, as shown in FIG. 1C, whereby the Al alloy film 2 is vertically etched as far as the surface of the Si wafer and the sidewall protective films 15 extend downwardly along the side faces of the step-like Al alloy film 2. Corrosion portions 2A formed in the Al alloy film 2 are described later.

When the second plasma etching is terminated, the etching parameters P and Cl must be changed in order to perform a third plasma etching. For this purpose, the high-frequency power source is turned off to suspend the production of plasma. An etching switching period T5 (for 10 seconds) starts.

When the pressure P within the chamber and the amount Cl of supplied gas reach 10 Torr and 70 SCCM, respectively, the high-frequency power source is turned on again, and a third plasma etching period T6 (for 30 seconds) starts. In the period TG. the surface of the Si wafer 1 is partially etched (over etched), as shown in FIG. 1D. Etching residue and parts of the Al alloy film 2 remaining between wirings, if any, after the patterning by the first and second plasma etching processes are etched away. As a result, the wirings are securely insulated from each other.

The sidewall protective films 15 and the photoresist 4 are removed, so that the patterned Al alloy film 2 is left on the Si wafer 1. The patterning of the Al alloy film 2 by plasma etching is completed.

The conventional plasma etching process has been composed of the plurality of partial plasma etching processes. The production of plasma is suspended in the etching switching periods for replacing the etching parameters for one of the partial plasma etching processes with those for the next partial plasma etching process.

While parts of the Al alloy film 2 which must be etched away are still present, for example, in the etching switching period T3 shown in FIG. 2, the gas molecules react with the surface portions of the Al alloy film 2, so that the Al alloy film 2 is etched. Since no plasma is produced at this time and accordingly no ion sheath potential is present, the Al alloy film 2 is isotropically etched, as shown in FIG. 4.

The details of this process are illustrated in FIGS. 5A to 5C. Parts of the Al alloy film 2 react with the gas molecules 11 to form reaction products 18. Since this reaction proceeds isotropically over the exposed faces of the Al alloy film 2, parts of the Al alloy film 2 under the sidewalls of the photoresist 4 are etched to form the corrosion portions 2A. The corrosion portions 2A remain partially on the sidewalls of the Al alloy film 2 after the second and third plasma etching processes as shown in FIGS. 1C to 1E. The presence of the corrosion portions 2A deteriorates long-term reliability on conductivity. The remaining reaction products 18 such as $AlCl_3$ in the corrosion portions 2A react with $H_2O$ and the like in the later steps to form HCl. There has been a problem that the Al alloy film 2 is further corroded by the produced HCl.

The time required for the completion of etching is the sum of the periods T1 to T6 of FIG. 2. Another problem is that throughput in a series of etching processes is not high because of the relatively long total time.

SUMMARY OF THE INVENTION

The present invention is directed to a method of selectively removing an object layer formed on a substrate through plasma etching process.

According to the present invention, said method comprises the steps of: (a) obtaining an object body in which said object layer is formed on said substrate and a resist pattern layer is provided on said object layer; (b) applying gas plasma to said object body under a first plasma condition to selectively remove a surface part of said object layer: (c) changing said first plasma condition to a second plasma condition without stopping generation of gas plasma; and (d) applying gas plasma to said object body under said second plasma condition to selectively remove a remaining part of said object layer which is not removed in the step (b).

In an aspect of the present invention, the method further comprising the steps of: (e) changing said second plasma condition to a third plasma condition without stopping generation of gas plasma; and (f) applying gas plasma to said object body under said third plasma condition to selectively remove a surface part of said substrate.

Preferably, the first to third plasma condition are distinguished from each other in the rate of etching gas flow and the pressure of the etching gas.

Since generation of the plasma is not stopped even in the periods for changing the plasma condition, isotropic etching which causes a corrosion portion in the object layer is effectively prevented.

Further, the plasma etching is conducted without stops thereof, total time required for terminating the etching is reduced, so that the throughput is improved.

Accordingly, an object of the present invention is to provide a process for plasma etching with high throughput, in which no isotropic etching is performed.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 6:
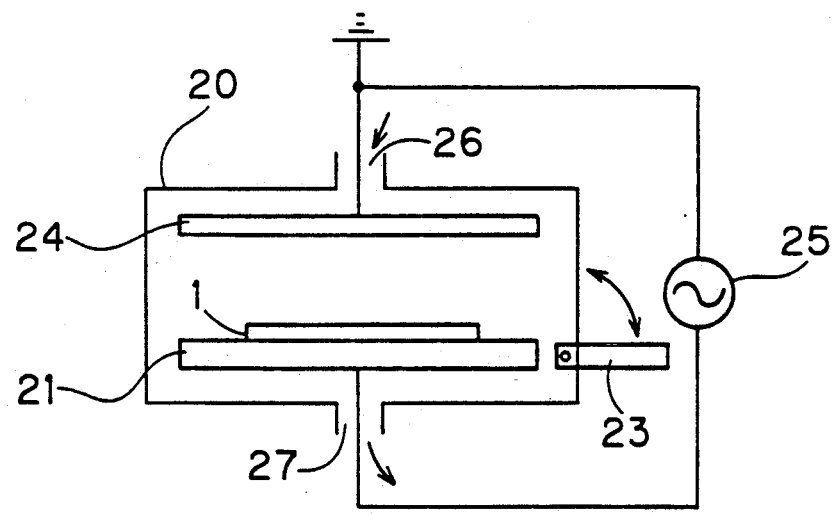
FIG. 6 is a sectional view of a plasma etching device according to the present invention.

FIG. 6 is a schematic sectional view of a plasma etching device according to the present invention. As shown in FIG. 6, a Si wafer 1 is placed on a lower electrode 21 provided within a chamber 20. A layer to be etched and a mask layer, which are described later and not shown in FIG. 6, are formed on the upper major surface of the Si wafer 1. The chamber 20 is provided with a door 23 capable of opening and closing on the side face thereof. The Si wafer 1 can be taken in and out through the door 23. An etching gas is introduced into the chamber 20 through an inlet 26 and exhausted from the chamber 20 through an outlet 27.

An upper electrode 24 corresponding to the lower electrode 21 is provided in the upper part of the chamber 20. The upper electrode 24 is electrically grounded. A high-frequency power source 25 is connected between the upper and lower electrodes 24 and 21.

Figure 1:
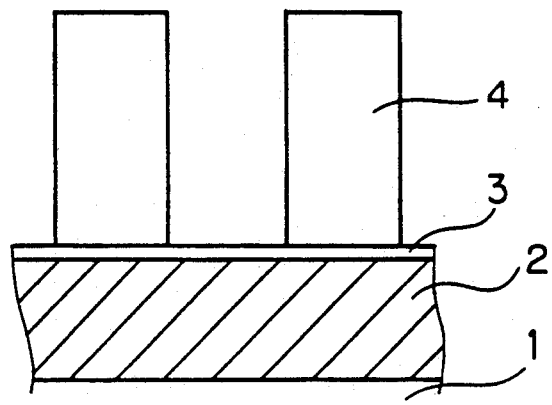
FIGS. 1A to 1E are sectional views illustrating various stages of a conventional plasma etching process.
Figure 1:
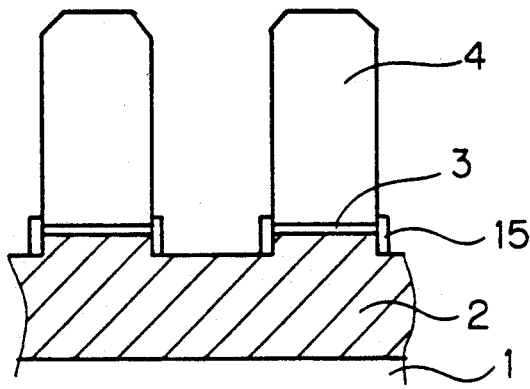
Figure 1:
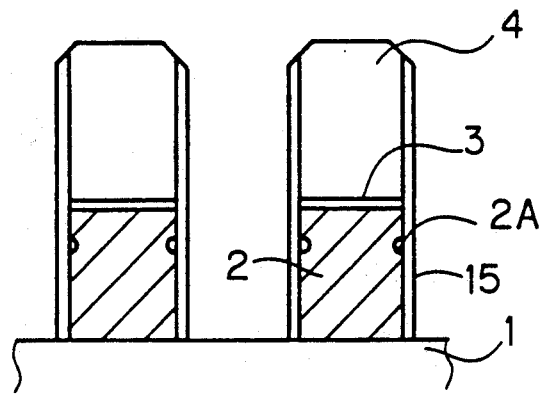
Figure 1:
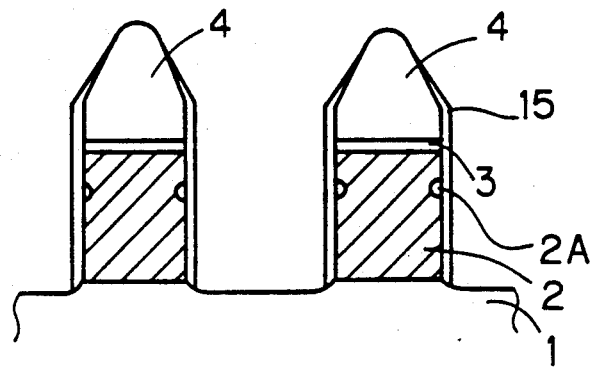
Figure 1:
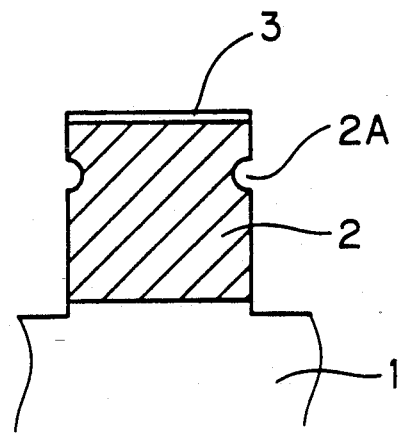
Figure 2:
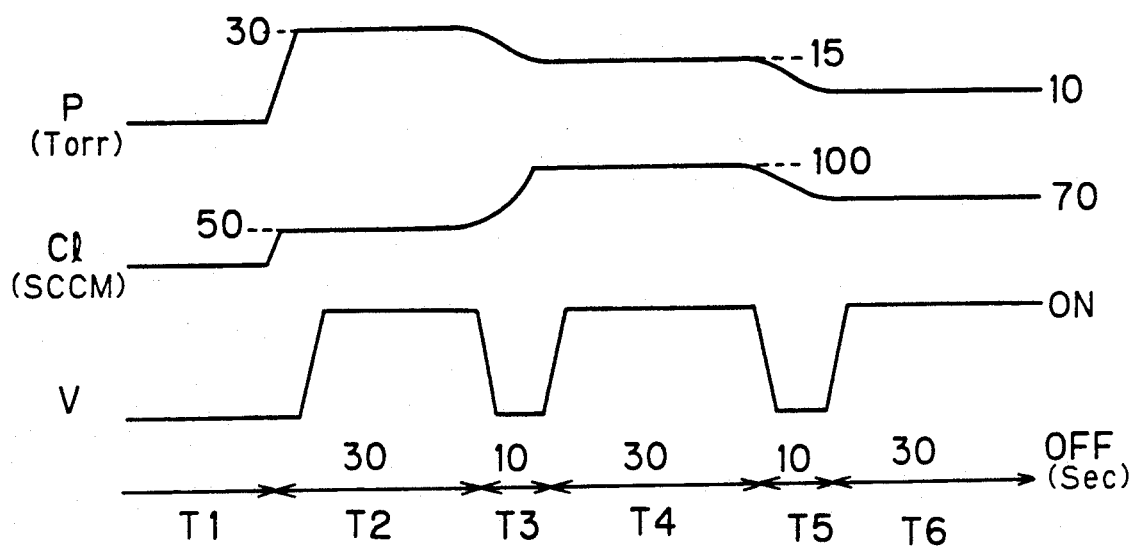
FIG. 2 is a graph showing stepwise changes in etching parameters in the conventional plasma etching process.
Figure 3:
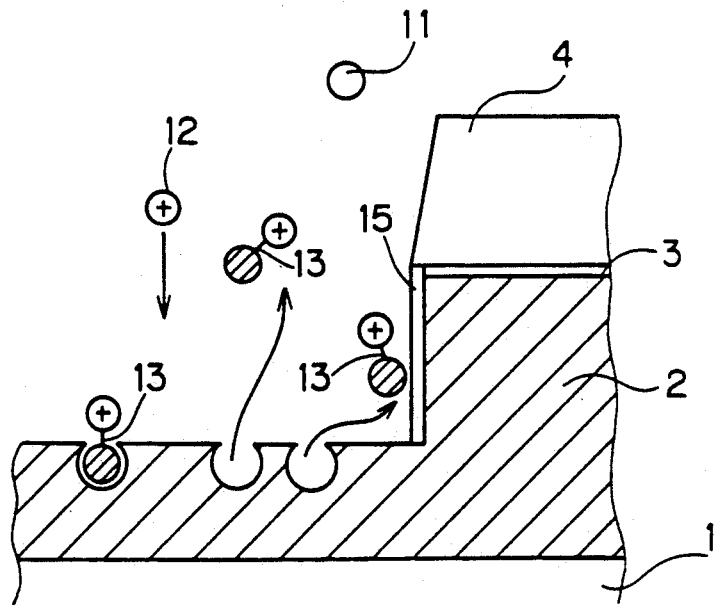
FIG. 3 is a sectional view illustrating the principle of the plasma etching process.
Figure 4:
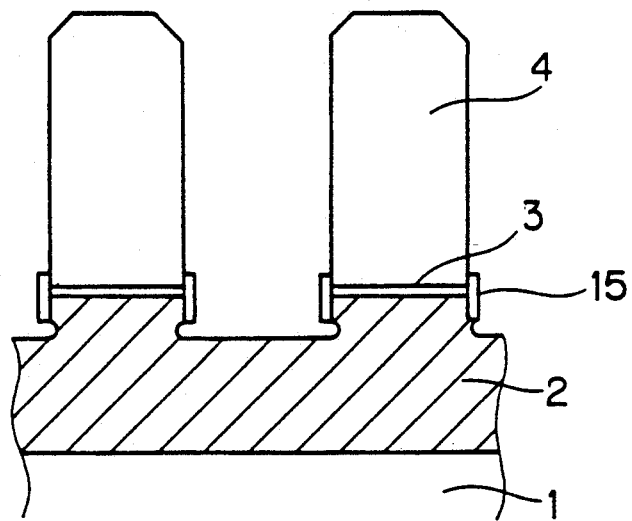
FIG. 4 and FIGS. 5A to 5C are sectional views illustrating problems of the conventional plasma etching process.
Figure 5A:
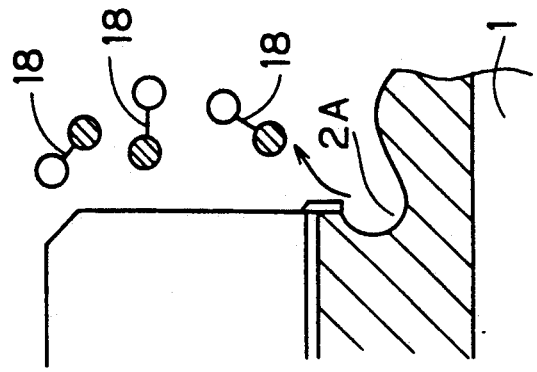
Figure 5B:
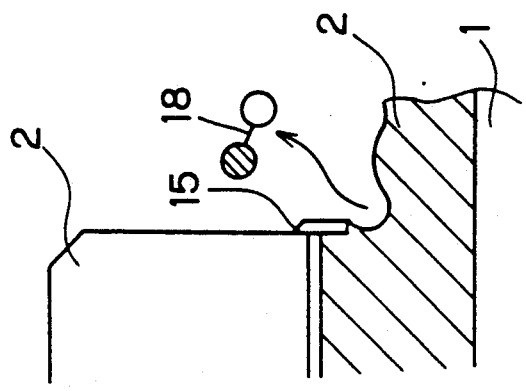
Figure 5C:
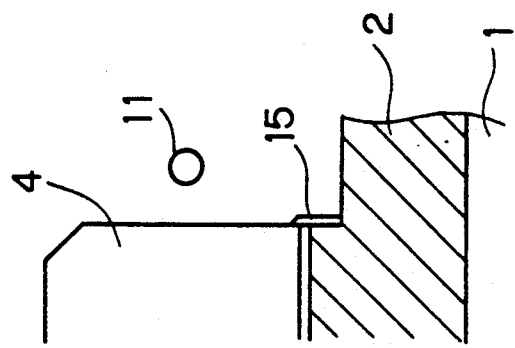

FIGS. 7A to 7E are sectional views illustrating various stages of a plasma etching process according to a preferred embodiment of the present invention. FIG. 8 is a waveform chart illustrating stepwise changes in etching parameters and the like in the plasma etching process. The reference characters P, Cl and V of FIG. 8 designate parameters similar to those of FIG. 2.

Figure 7:
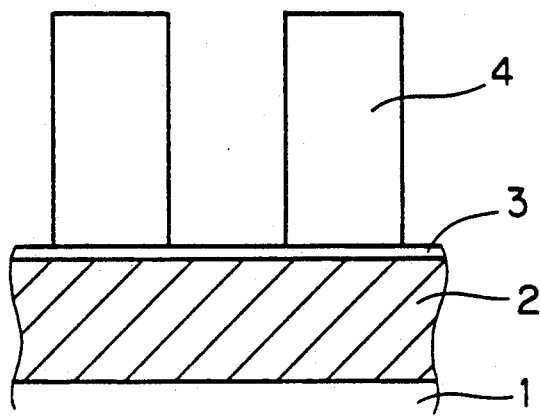
FIGS. 7A to 7E are sectional views illustrating various stages of a plasma etching process according to the present invention.
Figure 7:
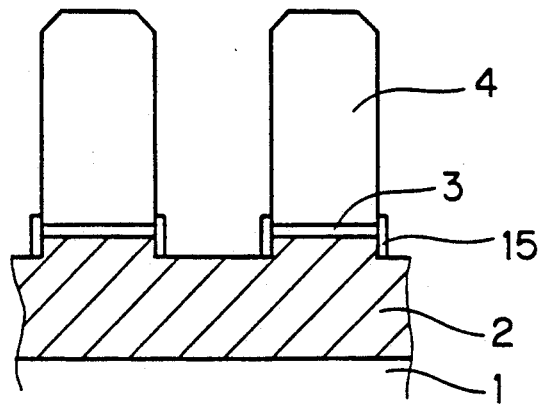
Figure 7:
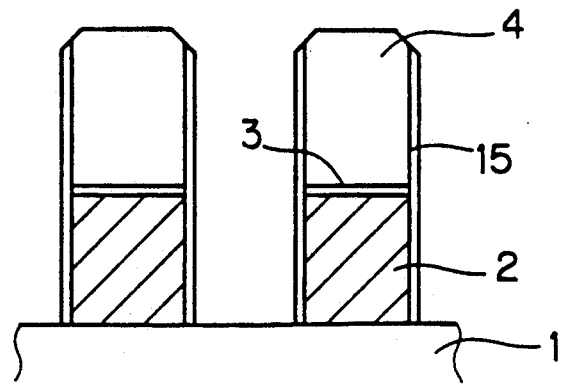
Figure 7:
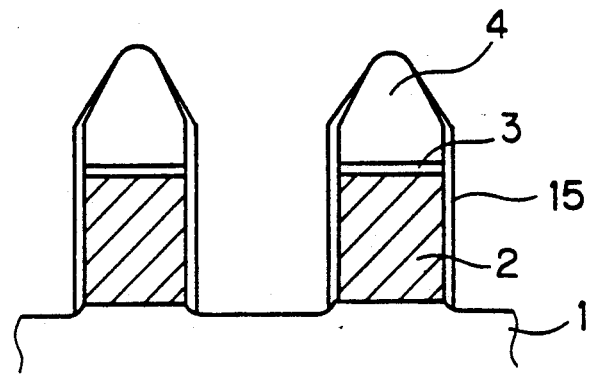
Figure 7:
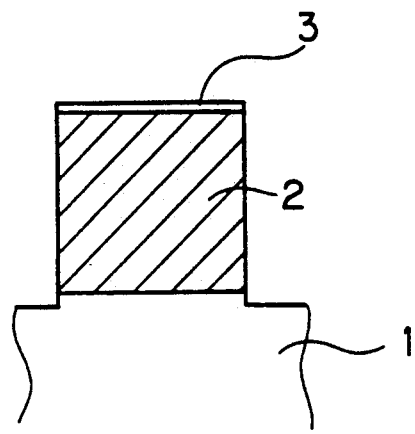
Figure 8:
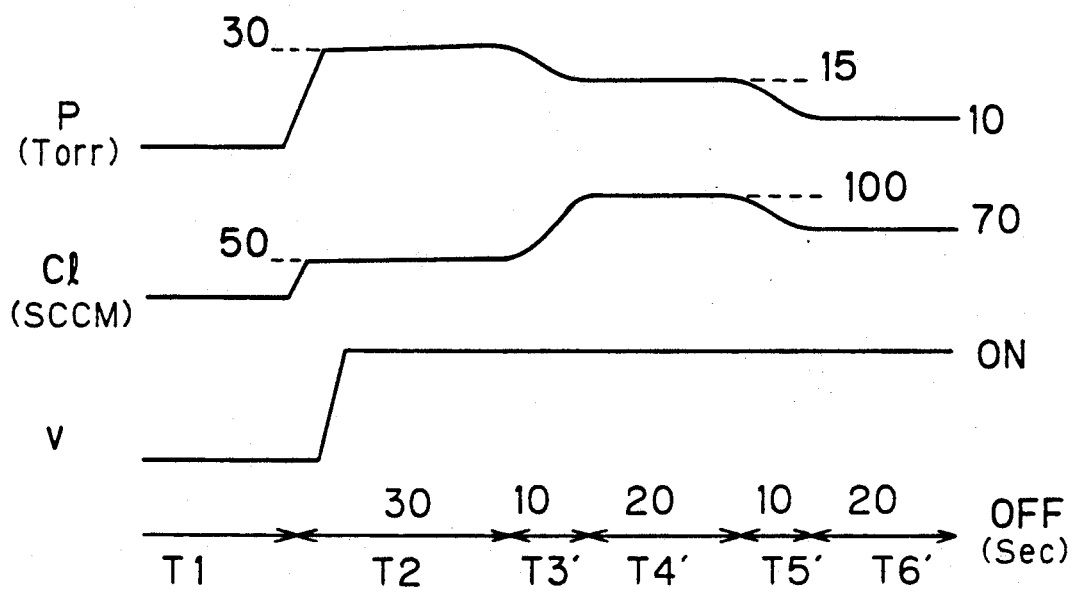
FIG. 8 is a graph showing stepwise changes in etching parameters in the plasma etching process according to the present invention.

Referring to FIG. 7A, an Al alloy film 2 to be etched which is wiring material is formed on the substrate of the Si wafer 1. A spontaneous oxide film 3 is formed on the Al alloy film 2. A photoresist 4 patterned by photolithography technique and acting as a mask is formed on the spontaneous oxide film 3. The initial state in a standby period T1 of FIG. 8 is illustrated in FIG. 7A.

A first plasma etching period T2 (for 30 seconds) starts which is mainly intended for etching the spontaneous oxide film 3. In the period T2, the etching parameters of the pressure P within the chamber 20 and the amount Cl of chlorine or chlorine compound gas supplied to the chamber 20 are set to target values of 30 Torr and 50 SCCM, respectively. The gas is introduced into the chamber 20 through the inlet 26. The pressure is set by adjusting the amount of gas exhausted through the outlet 27. When the parameters P and Cl reach the target values, the high-frequency power source 25 is turned on. A high-frequency voltage is applied across the upper and lower electrodes 24 and 21, and plasma is produced within the chamber 20. Cationic exited molecules of the etching gas are accelerated by ion sheath potential formed in the vicinity of the Si wafer 1. The exited molecules or etching species react with the surface portions of the Al alloy film 2 to form reaction products. The spontaneous oxide film 3 and the surface portions of the Al alloy film 2 are etched vertically. Similarly to the prior art, sidewall protective films 15 (in FIG. 7B) are formed.

When the first plasma etching is terminated, the etching parameters P and Cl must be changed in order to perform a second plasma etching which is mainly intended for the etching of the Al alloy film 2. For this purpose, an etching switching period T3' (for 10 seconds) starts. Unlike the prior art, however, the high-frequency power source 25 is held "on" in the period T3' according to the preferred embodiment.

Since the production of plasma is continued in the etching switching period T3', plasma etching is continuously performed while changing the etching parameters. Similarly to the first plasma etching, the Al alloy film 2 is etched perpendicularly to the surface thereof while the sidewall protective films 15 extend along the side faces of the step-like Al alloy film 2.

When the pressure P within the chamber 20 and the amount Cl of supplied gas reach 15 Torr and 100 SCCM, respectively, a second plasma etching period T4' (for 20 seconds) starts. In the period T4', the Al alloy film 2 is plasma etched as far as the surface of the Si wafer 1, as shown in FIG. 7C, and the sidewall protective films 15 further extend along the side faces of the step-like Al alloy film 2.

When the second plasma etching is terminated, the etching parameters P and Cl must be changed in order to perform a third plasma etching. For this purpose, an etching switching period T5'(for 10 seconds) starts. The high-frequency power source 25 is held "on" in the period T5'. The plasma etching is continuously performed while changing the etching parameters in the period T6', so that the Si wafer is etched over etched) perpendicularly to the surface thereof.

When the pressure P within the chamber 20 and the amount Cl of supplied gas reach 10 Torr and 70 SCCM, respectively, a third plasma etching period T6' (for 20 seconds) starts. In the period T6', the plasma etching is performed on the Al alloy film 2. As shown in FIG. 7D, the surface of the Si wafer 1 is partially etched furthermore. Etching residue and parts of the Al alloy film 2 remaining between wirings, if any, after the patterning by the first and second plasma etching processes are etched away. As a result, the wirings are securely insulated from each other.

The sidewall protective films 15 and the photoresist 4 are removed, so that the patterned Al alloy film 2 is left on the Si wafer 1, as shown in FIG. 7E. The patterning of the Al alloy film 2 by plasma etching is completed.

As described above, the production of plasma is continued in the periods for changing the etching parameters, that is, in the etching switching periods between the first, second and third plasma etching processes. Hence, the plasma etching is continuously performed in all of the periods T2 to T6' except the standby period T1. Since there is no period in which isotropic plasma etching is performed, the Al alloy film 2 is not corroded laterally. As a result, reliability on the Al alloy film 2 is improved.

Since the plasma etching proceeds in the etching switching periods T3' and T5', the respectively following periods T4' and T6' (in FIG. 8) for the second and third plasma etching processes can be shorter than the conventional plasma etching periods T4 and T6 (in FIG. 2) by the time corresponding to the etching switching periods T3' and T5'. Thus, the whole plasma etching period can be shortened by about 20 seconds.

The chloride or chloride compound gas referred to in the preferred embodiment is BCl, CCl$_4$, SiCl$_4$, Cl$_2$ or the like. In the preferred embodiment, the high-frequency power source 25 is employed as plasma production means. The present invention is not limited to this, and is applicable to the cases where a magnetic field production source is additionally provided and where plasma is produced by microwaves or laser beams.

While the invention has been shown and described in detail, the foregoing description is in all aspects illustrative and not restrictive. It is therefore understood that numerous modifications and variations can be devised without departing from the scope of the invention.

We claim:

1. A method of selectively removing an object layer formed on a substrate through plasma etching process, said method comprising the steps of:
    (a) preparing a chamber which defines an inner space therein and comprises a couple of electrodes facing to each other across a gap space and obtaining an object body in which said object layer is formed on said substrate and a resist pattern layer is provided on said object layer;
    (b) introducing said object body into said inner space of said chamber and supporting said object body in said gap space between said couple of electrodes and applying gas plasma to said object body under a first plasma condition to selectively remove a surface part of said object layer;
    (c) changing said first plasma condition to a second plasma condition without stopping generation of gas plasma; and
    (d) applying gas plasma to said object body under said second plasma condition to selectively remove a remaining part of said object layer which is not removed in the step (b);
    (e) changing said second plasma condition to a third plasma condition without stopping generation of gas plasma; and
    (f) applying gas plasma to said object body under said third plasma condition to selectively remove a surface part of said substrate;
    wherein the steps (b) to (f) are conducted while continuously applying a high frequency electric voltage across said couple of electrodes.

2. The method of claim 1, wherein
the step (b) comprises the steps of:
    (b-1) supplying an etching gas into said inner space of said chamber under a first gas condition; and
    (b-2) applying said high frequency electric voltage across said couple of electrodes to generate gas plasma around said object body.

3. The method of claim 2, wherein
the step (c) comprises the step of:
    (c-1) changing said first gas condition to a second gas condition without stopping application of said high frequency electric voltage across said couple of electrodes; and
the step (d) comprises the steps of:
    (d-1) supplying said etching gas into said inner space of said chamber under said second gas condition; and
    (d-2) applying said high frequency electric voltage across said couple of electrodes to generate gas plasma around said object body.

4. The method of claim 3, wherein
the step (e) comprises the step of:
    (e-1) changing said second gas condition to a third gas condition without stopping application of said high frequency electric voltage across said couple of electrodes; and
the step (f) comprises the steps of:
    (f-1) supplying said etching gas into said inner space of said chamber under said third gas condition; and
    (f-2) applying said high frequency electric voltage across said couple of electrodes to generate gas plasma around said object body.

5. The method of claim 4, wherein
the step (b-1) comprises the steps of:

(b-1-1) supplying a first amount per second of said etching gas into said inner space of said chamber; and (b-1-2) controlling a gas pressure in said inner space of said chamber to a first pressure;

the step (c-1) comprises the steps of:

(c-1-1) changing a rate of supplying said etching gas to said inner space to a second amount per second; and (c-1-2) changing the gas pressure in said inner space of said chamber to a second pressure; and the step (d-1) comprises the steps of:

(d-1-1) supplying said second amount per second of said etching gas into said inner space of said chamber; and (d-1-2) maintaining the gas pressure in said inner space of said chamber at said second pressure.

6. The method of claim 5, wherein the step (e-i) comprises the steps of:

(e-1-1) changing the rate of supplying said etching gas to said inner space to a third amount per second; and (e-1-2) changing the gas pressure in said inner space of said chamber to a third pressure; and the step (f-1) comprises the steps of:

(f-1-1) supplying said third amount per second of said etching gas into said inner space of said chamber; and (f-1-2) maintaining the gas pressure in said inner space of said chamber at said third pressure.

7. The method of claim 6, wherein the step (a) comprises the steps of:

(a-1) obtaining said object body in which:

said object layer is a metal layer;

said substrate is a semiconductor substrate; and an oxide film is formed between said semiconductor substrate and said metal layer.

8. The method of claim 7, wherein the step (b) further comprises the steps of:

(b-3) applying gas plasma to said object body under said first plasma condition to selectively remove said oxide film together with said surface part of said object layer.

9. The method of claim 8, wherein the step (b) further comprises the steps of:

(b-4) selectively removing said surface part of said object layer through plasma etching to obtain a metal hill which is a part of said object layer not removed, wherein said hill has an exposed side wall having no corroded portions thereon;

(b-5) obtaining a reaction product which is generated through reaction of said gas plasma and said surface part of said object layer;

(b-6) depositing said reaction product on said side wall of said metal hill.

10. The method of claim 9, wherein the step (d) further comprises the steps of:

(d-3) selectively removing said remaining part of said object layer through plasma etching to increase the height of said metal hill and said side wall;

(d-4) further obtaining said reaction product which is generated through reaction of said gas plasma and said remaining part of said object layer;

(d-5) depositing on said side wall of said metal hill said reaction product obtained in the step (d-4).

11. A method of selectively removing an object layer formed on a substrate through plasma etching process, said method comprising the steps of:

preparing a chamber which defines an inner space therein and comprises a couple of electrodes facing to each other across a gap space;

obtaining an object body in which said object layer is formed on said substrate and a resist pattern layer is provided on said object layer;

introducing said object body into said inner space of said chamber and supporting said object body in said gap space between said couple of electrodes;

applying gas plasma to said object body under a first plasma condition to selectively remove a surface part of said object layer;

changing said first plasma condition to a second plasma condition without stopping generation of gas plasma; and applying gas plasma to said object body under said second plasma condition to selectively remove a remaining part of said object layer.

12. The method of claim 11, wherein the gas plasma are generated using a high frequency electric voltage applied across said couple of electrodes.

13. The method of claim 12, wherein the step of changing said first gas condition to a second gas condition is performed without stopping application of said high frequency electric voltage across said couple of electrodes.

14. A method of selectively removing an object layer formed on a substrate through plasma etching process, said method comprising the steps of:

preparing a chamber which defines an inner space therein and comprises a couple of electrodes facing to each other across a gap space, obtaining an object body in which said object layer is formed on said substrate and a resist pattern layer is provided on said object layer;

introducing said object body into said inner space of said chamber and supporting said object body in said gap space between said couple of electrodes;

supplying an etching gas into said inner space of said chamber under a first gas condition; and applying a high frequency electric voltage across said couple of electrodes to generate gas plasma around said object body to selectively remove a surface part of said object layer;

changing said first plasma condition to a second plasma condition without stopping generation of gas plasma; and applying gas plasma to said object body under said second plasma condition to selectively remove a remaining part of said object layer.

15. The method of claim 14, wherein the step of changing said first plasma condition to a second plasma condition is performed without stopping application of said high frequency electric voltage across said couple of electrodes.

* * * * *